Figure 1:
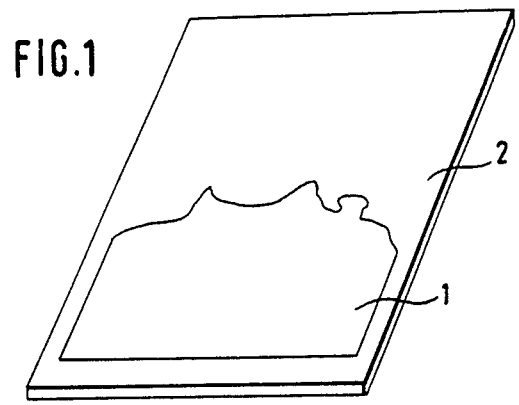

United States Patent [19]

Hendrikx

[11] Patent Number: 4,632,541
[45] Date of Patent: Dec. 30, 1986

[54] METHOD OF USING PHOTOGRAPHIC MONTAGE TO MAKE PORTRAIT PHOTOS IN PARTICULAR

[76] Inventor: Kristina Hendrikx, Camphausenstr. 10, D-4000 Dusseldorf, Fed. Rep. of Germany

[21] Appl. No.: 635,150

[22] Filed: Jul. 27, 1984

[30] Foreign Application Priority Data

Jul. 28, 1983 [DE] Fed. Rep. of Germany ....... 3327163

[51] Int. Cl.⁴ ............................................. G03B 27/02
[52] U.S. Cl. ..................................... 355/79; 355/132; 352/51
[58] Field of Search ..................... 355/132, 79, 39, 40; 352/45–47, 50–52, 87

[56] References Cited

U.S. PATENT DOCUMENTS

| | | | |
|---|---|---|---|
| 1,760,156 | 5/1930 | Mann | 352/51 |
| 1,928,579 | 9/1933 | Walker | 352/47 |
| 2,232,144 | 2/1941 | Sersen | 355/132 |
| 2,314,663 | 3/1943 | Seaman | 352/46 |
| 3,136,232 | 6/1964 | Shoberg et al. | 355/113 |
| 3,809,463 | 5/1974 | Winchell | 352/87 X |
| 3,817,614 | 6/1974 | Equini | 355/79 |

FOREIGN PATENT DOCUMENTS 884692 12/1961 United Kingdom ................. 355/79

*Primary Examiner*—Michael L. Gellner
*Assistant Examiner*—D. Rutledge
*Attorney, Agent, or Firm*—Shlesinger, Arkwright, Garvey & Fado

[57] ABSTRACT

In a method for preparing in partiuclar portrait photos by means of montage, a torso specimen is combined with a head specimen previously cut-out along its contour and fitted to scale, and this combination is photographed.

In order to prepare in simple and rapid manner a large number of different yet high-quality montages, the torso specimen is photomechanically transferred to a transparent foil, the transparent foil is opaqued on its back side in the area of the torso specimen, the transparent foil is placed on a background pattern and the head specimen is sandwiched between the transparent foil and the background pattern for its combination with the torso specimen.

9 Claims, 12 Drawing Figures

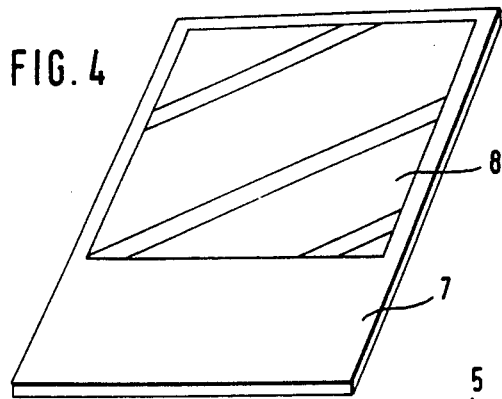
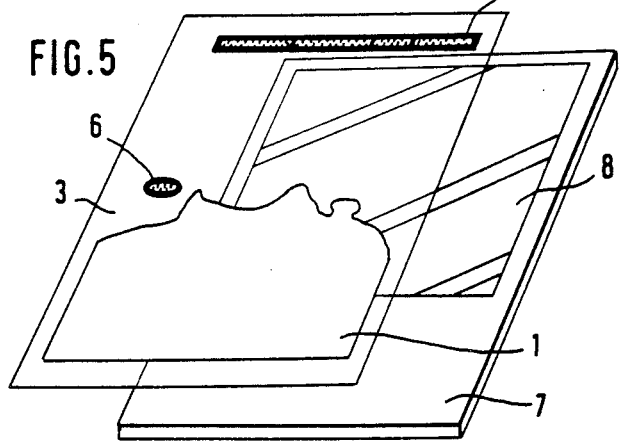
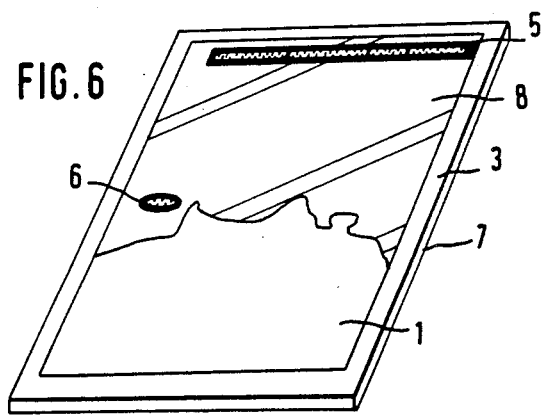

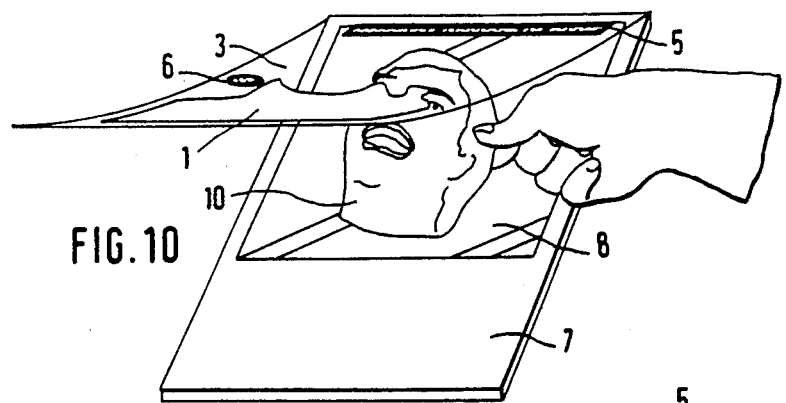
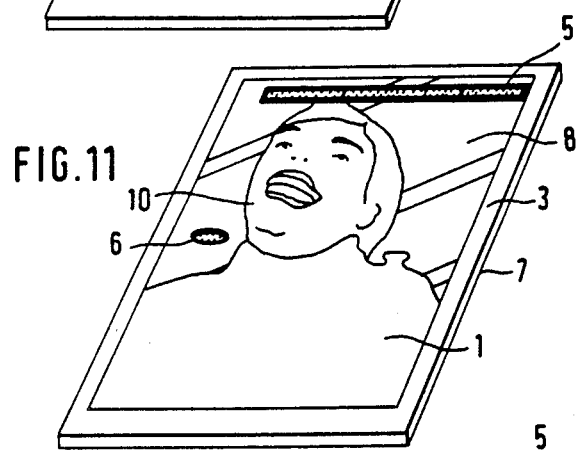
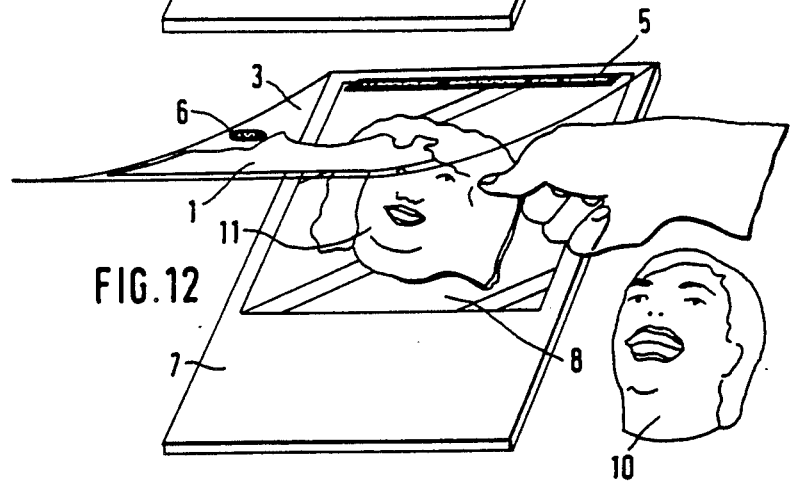

METHOD OF USING PHOTOGRAPHIC MONTAGE TO MAKE PORTRAIT PHOTOS IN PARTICULAR

The invention relates to a method for making portrait photos in particular by using photographic montage wherein a torso specimen is combined with a head speciment previously fitted to scale and cut out along its contour, and where this combination is then photographed.

Such photomontages are widely known. They combine a specific torso specimen, that is the reproduction of a body trunk, with the head specimen, that is the reproduction of a specific head, and this combination is then photographed. In this manner montages to achieve definite effects can be made which show the combination of a head with a torso not belonging to it.

Such a montage is quite costly and time-consuming. The fitting of the head specimen to the torso-specimen must be extremely accurate so that the desired effect is in fact also achieved, that is, the head should not appear foreign to the torso. It is even more difficult to fit the combination of head and torso into a given background, and for that reason such montages typically are made without a background.

It is the object of the present invention to further develop a method of the initially cited type whereby, in simple and rapid manner, a plurality of different yet high-quality montages can be made.

This problem is solved by the invention by photomechanically transferring the torso specimen on a transparent foil or sheet made of acetate, polyvinyl chloride or similar type of clear sheet material, by this transparent foil being opaqued on its back side in the area of the torso specimen, by placing the transparent foil on a background pattern, and by placing the head specimen between the transparent foil and the background pattern in order to combine the torso and head specimens. Additionally further patterns such as business, logos, advertising or the like can be deposited by the silk-scree process on the transparent foil, and preferably on its back side.

In the invention therefore an intermediate medium in the form of the transparent foil is produced for the torso specimen and possibly also for commercial logos, advertising and the like, which then can be placed on a background pattern, with the head specimen sandwiched between the two. No special fitting of the head specimen to the torso specimen need be made becaUse the lower part of the head specimen is so covered by the torso specimen on the transparent foil that perfect transition will be obtained.

This method furthermore provides the possibility to combine in simple and rapid manner the most diverse head specimens by merely exchanging them. Also various torso specimens on transparent foils and various background patterns can be arbitrarily combined with each other in simple and rapid manner. The photographic montages of the invention are characterized by a quality making it impossible to see that different components were combined.

The drawing shows the method of the invention in detail in the representation of the individual steps of the method relating to an illustrative montage.

Figure 2:
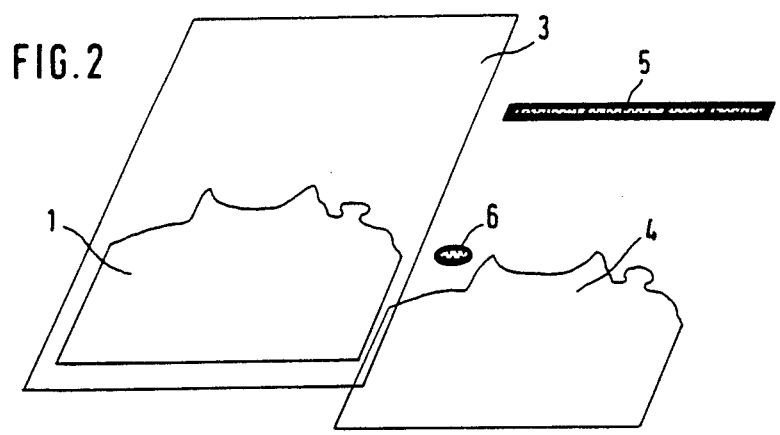
Figure 3:
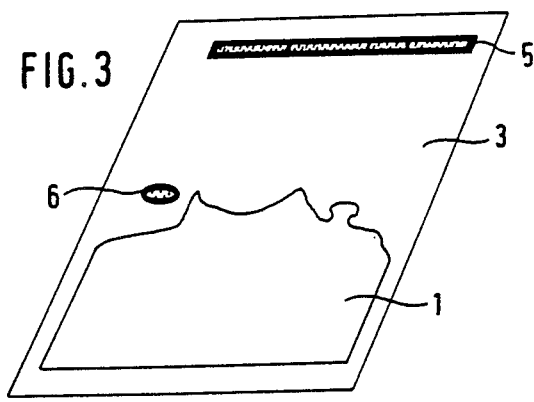
Figure 7:
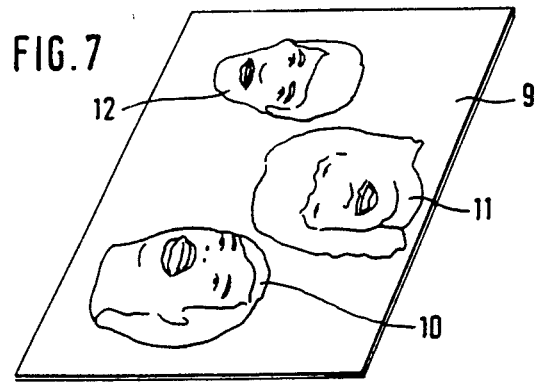
Figure 8:
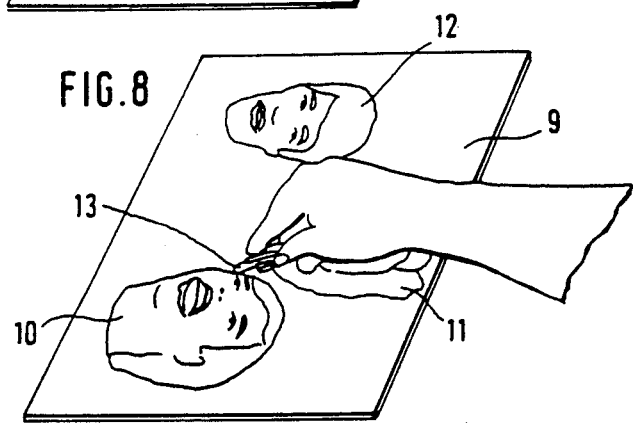
Figure 9:
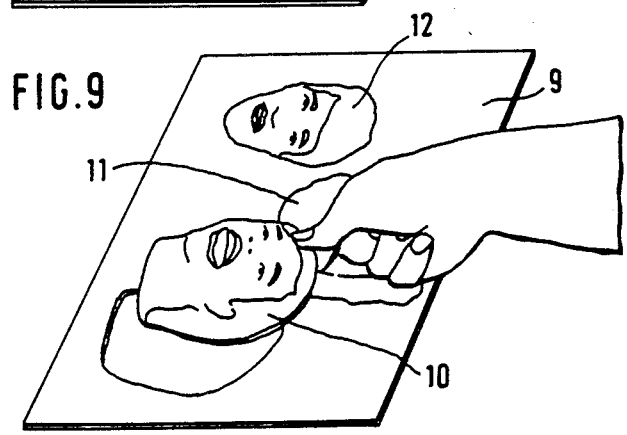

FIG. 1 is a torso specimen
FIG. 2 is a torso specimen of FIG. 1 transferred to a transparent foil together with a mask and two logos
FIG. 3 is the finished transparent foil of FIG. 2
FIG. 4 is a background pattern
FIG. 5 illustrates the deposition of the transparent foil of FIG. 3 on the background pattern of FIG. 4
FIG. 6 is the background pattern of FIG. 4 with the transparent foil of FIG. 3 deposited on it
FIG. 7 are head specimens
FIG. 8 shows the cutting out of of a head specimen
FIG. 9 shows the removal of a head specimen
FIG. 10 shows the sandwiching of a head specimen between the transparent foil of FIG. 3 and the background pattern of FIG. 4
FIG. 11 is the finished photographic montage, and
FIG. 12 shows exchanging the head specimen.

FIG. 1 shows a torso specimen 1 deposited on a substrate 2. By means of a conventionally known photomechanical process this torso specimen 1 is then transferred. The torso 1 is opaqued on the back side by a mask 4 coinciding with its contour so that while being on the transparent foil 3 it will be opaque. Furthermore logos 5 and 6 may be deposited by silk screening on the transparent foil, and appropriately so on the back side. These logos for instance may be advertising or entrepreneurial brands. FIG. 3 shows the transparent foil finished in this manner.

FIG. 4 shows a background pattern 8 drawn onto a substrate 7. FIG. 5 shows the procedure of depositing the transparent foil 3 of FIG. 3 on the substrate 7 and on the background pattern 8, thereby creating the montage of FIG. 6. The background pattern 8 in this case is partly covered by the torso specimen 1, but elsewhere, and except for the logos 5,6 it can be seen on account of the transparency of the foil.

FIG. 7 shows head specimens 10,11,12 mounted on a substrate 9, which were reproduced from photographs and in that procedure were fitted to the scale of the torso specimen 1. FIG. 8 shows how a head specimen 10 is manually cut out using a knife 13. In FIG. 9 the head specimen 10 is separated from the substrate 9.

After the transparent foil 3 is lifted, the head specimen 10 is placed on the background pattern 8 in such a manner that it will be properly located with respect to the torso specimen 1 when the transparent foil 3 is deposited again. The final montage is shown in FIG. 11. As shown, the upper edge of the torso specimen 1 covers the lower part of the neck section of the head specimen 10 in such a way that no fitting is required in this area. As a result, the head specimen 10 can be freely fitted to the torso specimen 1 until the most natural impression is achieved.

FIG. 12 shows the exchange of the head specimen 10 with the head specimen 11 of FIG. 7. No more is required than to take out the head specimen 10 and to replace it by the head specimen 11. This is rapid and simple per se. Therefore mass montages can be prepared using the same torso specimen and the same background pattern but different head specimens.

Furthermore it is obviously also possible to prepare several transparent foils with different torso specimens in order to exchange them as needed against the transparent foil 3 shown herein. Another variation is to prepare several substrates with different background patterns which can then be combined with the various head specimens and the various transparent foils in arbitrary manner. The method of the invention is therefore characterized by high flexibility with simple handling.

Obviously the method of the invention is not restricted to the photographic montage of portrait photographs. It can be applied wherever two image parts are to be mutually combined by* a third image part.

*original, presumably in typographical error, actually states "before"; HJ "in front of"

I claim:

1. A method for preparing a montage having variable rapidly interchangeable elements, comprising the steps of:
   (a) applying an opaque background scene to a flat, solid substrate,
   (b) applying a correctly scaled base photographic element for being fitted into the background scene onto a transparent sheet of material,
   (c) providing an opaque backing to the element on the reverse side of the transparent sheet which exactly matches the outline of the element,
   (d) mounting on an opaque substrate a series of identically scaled second photographic elements scaled to fit said first mentioned element and any one of which can be fitted to said base photographic element to provide a scaled composite unitary whole,
   (e) cutting out each of the second elements from the substrate along their outline,
   (f) removably mounting the transparent sheet with the base photographic element onto the substrate containing the background such that it covers the substrate with the base photographic element correctly positioned against the background which shows through the transparent sheet around the photographic base element,
   (g) selecting one of the cut-out second photographic elements and placing it on the substrate and under the transparent sheet in correct registery with the base photographic element to provide a complete scaled composite unitary figure.

2. The method as set forth in claim 1, including the step of:
   (a) applying by silk screen technique, commercial logos, advertising and captions to the transparent sheet.

3. The method of claim 1, including the steps of:
   (a) applying a base element comprising a torso specimen; and,
   (b) cutting out said second elements, each of said second elements comprising a head specimen.

4. The method of claim 1, including the step of:
   (a) applying an opaque backing comprising a mask.

5. A method for preparing a montage having variable rapidly interchangeable elements, comprising the steps of:
   (a) applying an opaque background to a substrate,
   (b) preparing a transparency having a correctly scaled base photographic transparent element and said transparency having front and rear surfaces,
   (c) applying an opaque backing to said rear surface, said backing conforming to and aligned with said element so that said element can only be viewed through said front surface of said transparency,
   (d) mounting on an opaque substrate a series of identically scaled second photographic elements scaled to fit said first mentioned element and any one of which can be fitted to said base photographic element to provide a scaled composite unitary whole,
   (e) cutting out each of said second elements from the associated substrate along their outline,
   (f) hingedly mounting said transparency onto said background substrate so that said background is viewable through said front surface around said base element and so that said transparency rear surface may be lifted from or lowered onto said background,
   (g) selecting one of the cut-out second photographic elements and lifting said transparency and placing the selected second element on the background substrate and under said transparency rear surface in correct registry with said base photographic element and lowering said transparency onto said background to provide a complete scaled composite unitary figure.

6. The method of claim 5, including the step of:
   (a) silk screening indicia patterns on said transparency.

7. The method of claim 6, including the step of:
   (a) silk screening said indicia patterns on said rear surface so as to be viewable through said front surface.

8. The method of claim 5, including the steps of:
   (a) preparing a base photographic element comprising a torso specimen; and,
   (b) cutting-out said second elements, each of said second elements comprising a head specimen.

9. The method of claim 5, including the step of:
   (a) applying an opaque backing comprising a mask.

* * * * *